United States Patent
Korzenski et al.

(10) Patent No.: US 7,160,815 B2
(45) Date of Patent: Jan. 9, 2007

(54) REMOVAL OF MEMS SACRIFICIAL LAYERS USING SUPERCRITICAL FLUID/CHEMICAL FORMULATIONS

(75) Inventors: Michael B. Korzenski, Danbury, CT (US); Thomas H. Baum, New Fairfield, CT (US); Chongying Xu, New Milford, CT (US); Eliodor G. Ghenciu, King of Prussia, PA (US)

(73) Assignee: Advanced Technology Materials, Inc., Danbury, CT (US)

( * ) Notice: Subject to any disclaimer, the term of this patent is extended or adjusted under 35 U.S.C. 154(b) by 153 days.

(21) Appl. No.: 10/782,355

(22) Filed: Feb. 19, 2004

(65) Prior Publication Data

US 2005/0118813 A1    Jun. 2, 2005

Related U.S. Application Data

(63) Continuation-in-part of application No. 10/724,791, filed on Dec. 1, 2003.

(51) Int. Cl.
*H01L 21/461* (2006.01)

(52) U.S. Cl. ............. 438/753; 438/756; 438/757; 510/175

(58) Field of Classification Search .......... 510/175, 510/176; 156/345.11; 438/745, 753, 756, 438/757; 134/1.3
See application file for complete search history.

(56) References Cited

U.S. PATENT DOCUMENTS

| | | | |
|---|---|---|---|
| 5,789,505 A | 8/1998 | Wilkinson et al. | |
| 6,149,828 A | 11/2000 | Vaartstra | |
| 6,306,564 B1 * | 10/2001 | Mullee | 430/329 |
| 6,521,466 B1 | 2/2003 | Castrucci | |
| 2003/0073302 A1 | 4/2003 | Huibers | |
| 2003/0125225 A1 * | 7/2003 | Xu et al. | 510/175 |
| 2004/0045588 A1 * | 3/2004 | DeYoung et al. | 134/26 |
| 2004/0259357 A1 * | 12/2004 | Saga | 438/689 |
| 2005/0118832 A1 * | 6/2005 | Korzenski et al. | 438/745 |
| 2005/0192193 A1 * | 9/2005 | Korzenski et al. | 510/175 |

OTHER PUBLICATIONS

U.S. Appl. No. 10/724,791, filed Dec. 1, 2003, Korzenski et al.

* cited by examiner

*Primary Examiner*—Tuan H. Nguyen
(74) *Attorney, Agent, or Firm*—Moore & Van Allen, PLLC; Tristan A. Fuierer; Maggie Chappuis

(57) ABSTRACT

A method and composition for removing silicon-containing sacrificial layers from Micro Electro Mechanical System (MEMS) and other semiconductor substrates having such sacrificial layers is described. The etching compositions include a supercritical fluid (SCF), an etchant species, a co-solvent, and optionally a surfactant. Such etching compositions overcome the intrinsic deficiency of SCFs as cleaning reagents, viz., the non-polar character of SCFs and their associated inability to solubilize polar species that must be removed from the semiconductor substrate. The resultant etched substrates experience lower incidents of stiction relative to substrates etched using conventional wet etching techniques.

32 Claims, 3 Drawing Sheets

REMOVAL OF MEMS SACRIFICIAL LAYERS USING SUPERCRITICAL FLUID/CHEMICAL FORMULATIONS

CROSS REFERENCE TO RELATED APPLICATIONS

This is a continuation-in-part of the U.S. patent application Ser. No. 10/724,791 for "Removal of MEMS Sacrificial Layers Using Supercritical Fluid/Chemical Formulations" filed on Dec. 1, 2003 in the name of Michael B. Korzenski et al.

FIELD OF THE INVENTION

The present invention relates to supercritical fluid-based compositions useful in semiconductor manufacturing for the removal of sacrificial layers, e.g., silicon, silicon oxide or silicon nitride, from Micro Electro Mechanical System (MEMS) and other substrates having such sacrificial layers. The compositions also have utility for removing post-ash and post-etch residue.

DESCRIPTION OF THE RELATED ART

Micro Electro Mechanical Systems (MEMS) are devices that integrate mechanical and electrical components on a single silicon wafer. The electrical and mechanical components are fabricated using traditional integrated circuit (IC) techniques and "micromachining" processes, respectively. Micromachining is used to produce a number of mechanical devices on the wafer that are able to sense and control the environment including, but not limited to, cantilever beams, hinges, accelerometers, microsensors, microactuators and micromirrors.

The mechanical components on a MEMS wafer are created by depositing sacrificial and structural layers onto a substrate followed by selective etching of the sacrificial layer relative to the structural layer, leaving behind a suspended or freestanding micromechanical structure, such as a beam or a lever. A major problem with fabricating MEMS structures is that as aqueous based etching of the sacrificial layer proceeds, stiction may occur, wherein the surface adhesion forces are higher than the mechanical restoring force of the microstructure. In effect, the microstructure bends down toward the substrate and sticks to it, generally permanently. Proposed causes of stiction include; van der Waals forces, hydrogen bridging and/or electrostatic attractions between the microstructure and the substrate, surface tension forces generated from diminishing liquid menisci trapped in the etched space, and etch by-products precipitating out of solution during drying steps.

Several methods of minimizing stiction have been proposed, including wet etching with HF, increasing surface roughness to minimize the surface tension energy, and eliminating water by drying the structures with a liquid that has no or little surface tension, e.g., isopropanol (IPA). Proposed alternative water-free etching compositions include anhydrous HF gas, which does not leave residues. However, etching with neat anhydrous HF can require up to ten hours to form complex microstructures and as such, the presence of some water is necessary to initiate the etch reaction thereby eliminating the advantages of using a water-free etchant.

Alternatively, supercritical fluids (SCF) can be used to etch MEMS and other semiconductor devices. Because of low viscosity and near zero surface tension, SCFs avoid many of the problems associated with typical wet processes. For example, because SCFs exhibit a gas-like density, surface tension forces are low and thus the microstructure does not stick to the substrate. Because of high diffusion rates, SCFs can generally penetrate a solid sample faster than liquid solvents. Further, SCFs can rapidly transport dissolved solutes because of their low viscosity. However, many SCFs are highly non-polar and as such, contaminant species are not adequately solubilized therein.

There is therefore a continuing need in the field for improved sacrificial layer etching compositions, since the etching of sacrificial layers from semiconductor substrates is critical to ensure production of MEMS and other semiconductor devices having exemplary operational abilities.

SUMMARY OF THE INVENTION

The present invention relates to supercritical fluid-based compositions useful in semiconductor manufacturing for the etching of sacrificial silicon-containing layers from semiconductor substrates, and methods of using such compositions for removal of same.

Further, the present invention relates to supercritical fluid-based compositions useful in semiconductor manufacturing for the removal of post-ash and post-etch residue from semiconductor surfaces, and methods of using such compositions for removal of same.

In one aspect, the invention relates to a sacrificial silicon-containing layer etching composition, comprising a supercritical fluid, at least one co-solvent, at least one etchant species, and optionally at least one surfactant.

In another aspect, the invention relates to a method of removing silicon-containing substances from a substrate having same thereon, said method comprising contacting the substrate with a SCF-based composition comprising a SCF, at least one co-solvent, at least one etchant species, and optionally at least one surfactant, for sufficient time and under sufficient contacting conditions to remove the silicon-containing substances from the substrate.

Other aspects, features and embodiments of the invention will be more fully apparent from the ensuing disclosure and appended claims.

DETAILED DESCRIPTION OF THE INVENTION, AND PREFERRED EMBODIMENTS THEREOF

Figure 1:
FIG. 1 is a control sample before SCF-based etching composition processing including a silicon substrate, a 100 nm thick silicon oxide film on the substrate and a 100 nm thick polysilicon film on the oxide.

The present invention is based on the discovery of supercritical fluid (SCF)-based etching compositions that are highly efficacious for the etching of sacrificial silicon-containing layers from semiconductor substrates. The compositions and methods of the invention are effective for etching sacrificial layers including, but not limited to, silicon, silicon oxide and silicon nitride ($Si_3N_4$) layers, and related post-ash and post-etch residue removal from patterned wafers.

Because of its readily manufactured character and its lack of toxicity and negligible environmental effects, supercritical carbon dioxide ($SCCO_2$) is a preferred SCF in the broad practice of the present invention, although the invention may be practiced with any suitable SCF species, with the choice of a particular SCF depending on the specific application involved. Other preferred SCF species useful in the practice of the invention include oxygen, argon, krypton, xenon, and ammonia. Specific reference to $SCCO_2$ hereinafter in the broad description of the invention is meant to provide an illustrative example of the present invention and is not meant to limit same in any way.

$SCCO_2$ might at first glance be regarded as an attractive reagent for removal of oxides and residue contaminants, since $SCCO_2$ has the characteristics of both a liquid and a gas. Like a gas, it diffuses rapidly, has low viscosity, near-zero surface tension, and penetrates easily into deep trenches and vias. Like a liquid, it has bulk flow capability as a "wash" medium.

However, despite these ostensible advantages, $SCCO_2$ is non-polar. Accordingly, it will not solubilize many polar species, including ionic etchant species comprising fluoride or inorganic salts and polar organic compounds that are present in many post-etch and post-ash residues. The non-polar character of $SCCO_2$ thus poses an impediment to its use for etching sacrificial layers and the subsequent cleaning of wafer surfaces of contaminant residues.

The present invention, however, is based on the discovery that disadvantages associated with the non-polarity of $SCCO_2$ and other SCFs can be overcome by appropriate formulation of SCF-based etching compositions with additives as hereinafter more fully described, and the accompanying discovery that etching a sacrificial silicon-containing layer with a SCF-based medium is highly effective and achieves damage-free, residue-free etching of the substrate having such sacrificial silicon-containing layers thereon.

In one aspect, the invention relates to SCF-based etching compositions useful in removing sacrificial silicon-containing layers including, but not limited to, silicon, silicon oxide and silicon nitride, from a semiconductor substrate. The formulation of the present invention comprises a SCF, at least one co-solvent, at least one etchant, and optionally at least one surfactant, present in the following ranges, based on the total weight of the composition:

| component of | % by weight |
| --- | --- |
| SCF | about 75.0% to about 99.5% |
| co-solvent | about 0.3% to about 22.5% |
| etchant | about 0.01% to about 5.0% |
| surfactant | about 0.01% to about 5.0% |

In the broad practice of the invention, the SCF-based etching formulations may comprise, consist of, or consist essentially of a SCF, at least one co-solvent, at least one etchant and optionally at least one surfactant.

The inclusion of the co-solvent with the SCF serves to increase the solubility of the etching composition for sacrificial silicon-containing species. In general, the specific proportions and amounts of SCF, co-solvent, etchant, and optionally surfactant, in relation to each other, may be suitably varied to provide the desired etching action of the SCF-based etching composition for the silicon-containing species and/or processing equipment, as readily determinable within the skill of the art without undue effort.

The co-solvent used in the SCF-based etching composition is preferably an alcohol. In one embodiment of the invention, such alcohol includes a straight-chain or branched $C_1$–$C_6$ alcohol (i.e., methanol, ethanol, isopropanol, etc.), or a mixture of two or more of such alcohol species. In a preferred embodiment, the alcohol is methanol or isopropanol (IPA).

Prior art silicon oxide and silicon nitride etching compositions contain the etchant HF, which dissociates in water to form the etchant species $F^-$, $H_2F^-$ and $H_2F_2$. However, in a $CO_2$ rich environment, the ionization of HF to form etchant species does not readily occur because the water reacts with the $CO_2$ (to form carbonic acid ($H_2CO_3$)) or is removed by the alcohol co-solvent.

As such, the silicon oxide and silicon nitride etchant used in the SCF-based etching composition of the present invention includes a pre-ionized fluoride source, such as a bifluoride species, including ammonium difluoride, tetraalkylammonium difluorides and alkyl phosphonium difluorides, such as those produced by the following reactions:

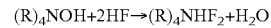

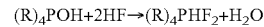

where R is hydrogen, methyl, ethyl, butyl, phenyl or fluorinated $C_1$–$C_4$ alkyl groups.

In the broad practice of the invention, the silicon oxide and silicon nitride etchant used in the SCF-based etching composition of the present invention may include the foregoing bifluoride species and/or HF. For example, reverse micelle technology may be used to encapsulate the HF within a reverse micelle for transport to the wafer surface without contact with the SCF. Potential reverse micelles include, but are not limited to, polymeric reverse micelles.

Surfactants are optionally added when the sacrificial silicon-containing layer includes silicon oxide and silicon nitride. The surfactant used in the SCF-based etching composition of the present invention may include nonionic surfactants, such as fluoroalkyl surfactants, polyethylene glycols, polypropylene glycols, polyethylene or polypropylene glycol ethers, carboxylic acid salts, dodecylbenzenesulfonic acid or salts thereof, polyacrylate polymers, dinonylphenyl polyoxyethylene, silicone or modified silicone polymers, acetylenic diols or modified acetylenic diols, and alkylammonium or modified alkylammonium salts, as well as combinations comprising at least one of the foregoing surfactants. Alternatively, the surfactants may be a mixture of anionic and non-ionic surfactants. In a preferred embodiment, the surfactant is a modified acetylenic diol.

In one embodiment, the SCF-based silicon dioxide and silicon nitride etching composition of the invention includes $SCCO_2$, methanol, ammonium bifluoride, and a modified acetylenic diol.

The silicon etchant used in the SCF-based etching composition of the present invention includes $XeF_2$, which are particularly well suited for etching MEMS and other semiconductor devices. XeF$_2$ etchants exhibit nearly infinite selectivity of silicon to photoresist, silicon oxides, silicon nitrides and aluminum. Being a vapor phase etchant, XeF$_2$ avoids many of the problems typically associated with wet processes. For example, XeF$_2$ surface tension forces are negligible and thus stiction between the microstructure and the substrate is less likely. In addition, etching rates using XeF$_2$ are much faster.

It has been proposed that XeF$_2$ etching of silicon involves the physisorption of XeF$_2$ onto the silicon surface. Because the bond energies of both the F atoms to the Xe atoms and the Si atoms to other Si atoms are sufficiently weak, and the attraction forces between Si and F are relatively strong, F will dissociate from Xe and bond to Si to form various silicon fluoride products, as illustrated in the following reactions:

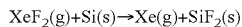

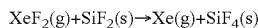

An etching reaction occurs when volatile SiF$_4$ is formed and leaves the surface spontaneously, thus removing sacrificial silicon material.

In the broad practice of the invention, the silicon etchant used in the SCF-based etching composition of the present invention may include the XeF$_2$ species and/or HF.

Notably, the XeF$_2$ etch rate is highly dependent on the dryness of the silicon surface. If water is present on the surface of the silicon, a thin silicon fluoride polymer layer forms. Accordingly, the broad practice of the invention includes wafer surface drying prior to exposure to an SCF-based etching composition containing XeF$_2$. For example, SCCO$_2$ provides an efficient and environmentally safe way to dehydrate the wafer surface, thus eliminating the formation of the unwanted silicon fluoride polymer layer. Further, pre-drying the silicon surface with SCCO$_2$ is also a necessary safety measure since most XeF$_2$ contains small amounts of XeF$_4$, which upon reaction with water forms the contact explosive XeO$_3$.

Species such as XeF$_2$ are largely insoluble in the non-polar SCF solvents. Accordingly, co-solvents are added to the composition to increase the solubility of XeF$_2$ in the SCF-based etching composition of the present invention.

In one embodiment, the SCF-based silicon etching composition of the invention includes SCCO$_2$, methanol and XeF$_2$.

In another aspect, the invention relates to methods of removal of sacrificial silicon-containing layers including, but not limited to, silicon, silicon oxide, silicon nitride and post-ash and post-etch residues, from a semiconductor substrate using the appropriate SCF-based etching composition.

In another aspect, the present invention relates to the removal of post-ash and post-etch residues using a SCF-based etching composition including a SCF, at least one co-solvent, at least one etchant, and optionally at least one surfactant, as described herein.

At present, the favored technique to remove developed photoresist is plasma ashing. Plasma ashing involves exposing the photoresist-covered wafer to oxygen plasma in order to oxidatively decompose the unexposed photoresist film from the substrate surface. However, plasma etching usually results in the formation of plasma-ash and plasma-etch residue, and this residue must subsequently be removed.

The removal of post-ash and post-etch residue is a well known problem in light of the continuing and rapid decrease in critical dimensions of microelectronic device structures, since any residue remaining on the substrate can render the final device deficient or even useless for its intended purpose.

Conventional post-ash and post-etch residue cleaning by wet chemical treatment has not proven wholly satisfactory in effecting complete removal of residues from the substrate, especially from trenches, vias and microstructures in low k dielectrics. Further, these conventional cleaning approaches are time-consuming, costly, require substantial amounts of chemical reagents for the cleaning operation and produce substantial quantities of chemical waste.

The SCF-based compositions of the present invention overcome the disadvantages of the prior art post-ash and post-etch residue removal treatments for Si-, SiO$_2$- and Si$_3$N$_4$-based residues.

The appropriate SCF-based etching composition can be employed to contact a substrate having a sacrificial layer, e.g., silicon oxide, silicon nitride or silicon, and/or post-ash and post-etch residue, at a pressure in a range of from about 1400 to about 4400 psi for sufficient time to effect the desired etching of the sacrificial layer and/or residue, e.g., for a contacting time in a range of from about 30 seconds to about 30 minutes and a temperature of from about 40 to about 70° C., although greater or lesser contacting durations and temperatures may be advantageously employed in the broad practice of the present invention, where warranted.

The removal process in a particularly preferred embodiment includes sequential processing steps including dynamic flow of the SCF-based etching composition over the substrate having the sacrificial layer and/or residue, followed by a static soak of the substrate in the SCF-based etching composition, with the respective dynamic flow and static soak steps being carried out alternatingly and repetitively, in a cycle of such alternating steps.

A "dynamic" contacting mode involves continuous flow of the cleaning composition over the wafer surface, to maximize the mass transfer gradient and effect complete removal of the sacrificial layer and/or residue from the substrate. A "static soak" contacting mode involves contacting the wafer surface with a static volume of the etching composition, and maintaining contact therewith for a continued (soaking) period of time.

For example, the dynamic flow/static soak steps may be carried out for four successive cycles in the aforementioned illustrative embodiment, as including a sequence of 30 sec–10 min dynamic flow, 30 sec–5 min high pressure static soak, e.g., about 3000 psi to about 4400 psi, 30 sec–10 min dynamic flow, and 30 sec–10 min low pressure static soak, e.g., about 1400 psi to about 2800 psi.

With regards to the silicon layers to be etched, the wafer surface should be dehydrated prior to the etching process. SCFs can be used as drying media for patterned wafers in drying compositions that include one or more water-reactive agents that chemically react with water on the patterned wafer to form reaction product species that are more soluble in the SCF than water.

As an illustrative example, hexafluoroacetone (HFA) is usefully employed as a water-reactive agent in SCCO$_2$ to provide a highly effective SCF composition for drying of patterned wafers. In such composition, HFA reacts instantly with water and quantitatively forms a soluble and volatile diol as depicted in the following reaction:

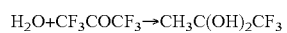

The product diol, CH$_3$C(OH)$_2$CF$_3$, is highly soluble in SCCO$_2$ and is readily dissolved by the SCF, thereby effectively removing water from the patterned wafer substrate with which the SCF composition, containing $SCCO_2$ and HFA, is contacted.

More generally, the water-reactive agent in the SCF-based wafer drying composition can be of any suitable type, including for example, other halogenated aldehydes and ketones; halogenated diketones, e.g., 1,1,1,5,5,5-hexafluoro-2,4-pentanedione, alternatively denoted as (hfac)H; halogenated esters; carboxylic anhydrides, e.g., $(CH_3CO)_2O$; siloxanes, halogenated silanes; and any other compounds and materials that easily react with water and form derivatives soluble in $SCCO_2$ or other SCF species.

Generally, the water-reactive agent can be formulated in the SCF-based wafer drying composition at any suitable concentration that is effective for water removal from the patterned wafer substrate. In various embodiments, depending on the particular SCF species employed, the concentration of the water-reactive agent can be a concentration in a range of from about 0.01 to about 10.0% by weight, based on the total weight of the supercritical fluid and the water-reactive agent, with concentrations of from about 0.1 to about 7.5% by weight, on the same total weight basis being more preferred, and from about 0.1 to about 5.0% by weight, on the same total weight basis being most preferred.

The contacting of the patterned substrate with the drying composition is carried out for a suitable period of time, which in a specific embodiment can for example be on the order of from about 20 to about 60 seconds, although other (longer or shorter) periods of contacting may be usefully employed depending on the nature and amount of the water to be removed from the patterned substrate, and the process conditions employed for drying.

Following drying of the patterned substrate, the contacting vessel in which the SCF-based wafer drying composition is contacted with the patterned substrate can be rapidly decompressed to separate the SCF composition from the patterned substrate and exhaust the regasified SCF from the contacting vessel, so that the non-supercritical component(s), such as the soluble water reaction product(s), can be entrained in the regasified SCF and likewise be removed from the drying locus. Thereafter, the contacting vessel can be compressed and the SCF-based etching composition may be introduced to the vessel to remove the sacrificial layer and/or residue.

Following the contacting of the SCF-based etching composition with the substrate bearing the sacrificial layer and/or residue, the substrate thereafter preferably is washed with copious amounts of SCF/methanol/deionized water solution in a first washing step, to remove any residual precipitated chemical additives from the substrate region in which etching and/or residue removal has been effected, and finally with copious amounts of pure SCF, in a second washing step, to remove any residual methanol co-solvent and/or precipitated chemical additives from the substrate region. Preferably, the SCF used for washing is $SCCO_2$.

The SCF-based etching compositions of the present invention are readily formulated by simple mixing of ingredients, e.g., in a mixing vessel under gentle agitation.

Once formulated, such SCF-based etching compositions are applied to the substrate for contacting with the sacrificial layer and/or residue thereon, at suitable elevated pressures, e.g., in a pressurized contacting chamber to which the etching composition is supplied at suitable volumetric rate and amount to effect the desired contacting operation for removal of the sacrificial layer and/or residue.

It will be appreciated that specific contacting conditions for the etching compositions of the invention are readily determinable within the skill of the art, based on the disclosure herein, and that the specific proportions of ingredients and concentrations of ingredients in the etching compositions of the invention may be widely varied while achieving desired removal of the sacrificial layer and/or residue from the substrate.

The features and advantages of the invention are more fully shown by the illustrative example discussed below.

The sample wafers examined in this study included a substrate, a 100 nm thick silicon oxide film on the substrate and a 100 nm polysilicon film on top of the oxide layer. The samples were processed to etch the sacrificial silicon oxide layer using the SCF-based etching composition of the following formulation:

| Component | Weight Percent |
| --- | --- |
| ammonium bifluoride (32.3 wt %) | 1.0% |
| surfynol-104 | 0.05% |
| methanol | 4.0% |
| $SCCO_2$ | 94.95% |

Alternatively, the sample wafers may include a substrate, a 380 nm thick silicon film on the substrate, a 30 nm silicon oxide film on the silicon film, and a 300 nm silicon nitride film on top of the oxide layer. The samples may be processed to etch the sacrificial silicon oxide layer using the SCF-based etching composition of the following formulation:

| Component | Weight Percent |
| --- | --- |
| ammonium bifluoride (32.3 wt %) | 1.0% |
| surfynol-104 | 0.05% |
| methanol | 4.0% |
| $SCCO_2$ | 94.95% |

The temperature was maintained at 50° C. throughout the cleaning/rinsing procedure. The optimal process conditions are dynamic flow of the SCF-based etching composition for 45 sec at 4000 psi followed by a 1 min $SCCO_2$ rinse. The samples were then thoroughly rinsed with copious amounts of $SCCO_2$/methanol/deionized water and pure $SCCO_2$ in order to remove any residual co-solvent and/or precipitated chemical additives.

The results are shown in FIGS. 1–5, as described hereinbelow.

Figure 3:
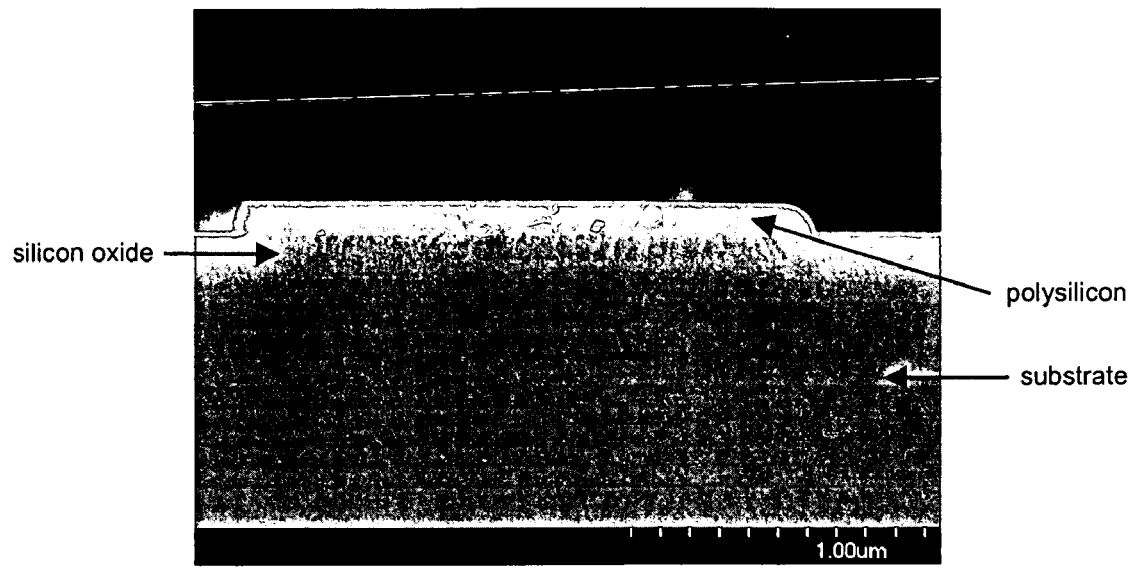
FIG. 3 is a control sample before SCF-based etching composition processing including a silicon substrate, a 100 nm thick silicon oxide film on the substrate and a 100 nm thick polysilicon film on the oxide.

FIGS. 1 and 3 are optical microscope photographs of control wafers prior to etching, showing unremoved sacrificial silicon oxide layers.

Figure 2:
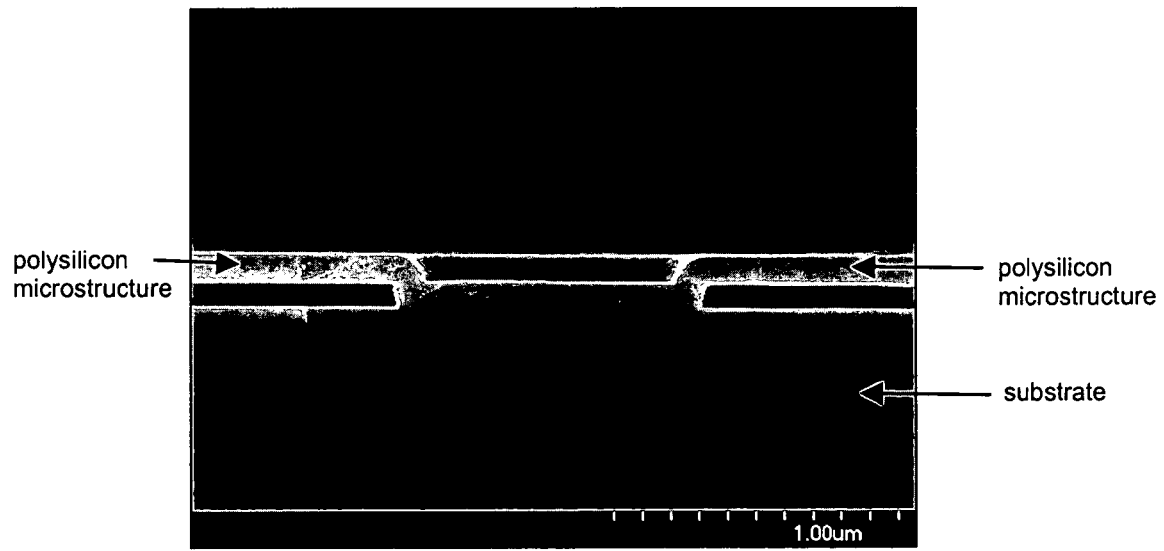
FIG. 2 is the control sample in FIG. 1 after the sacrificial silicon oxide layer was etched with a SCF-based etching composition of the present invention, illustrating a free standing microstructure.
Figure 4:
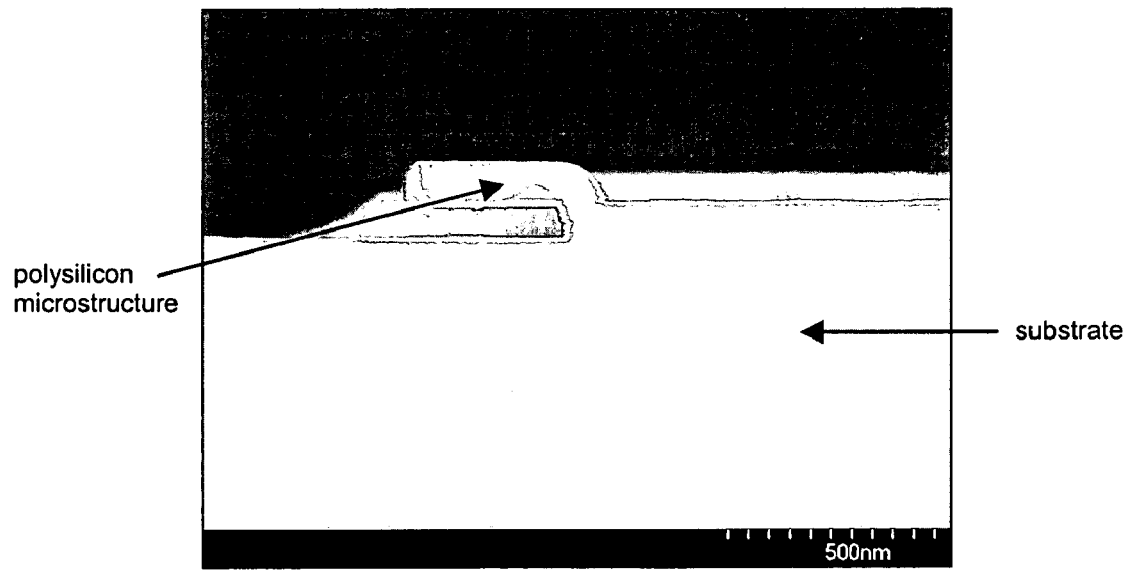
FIG. 4 is the control sample in FIG. 3 after the sacrificial silicon oxide layer was etched with a SCF-based etching composition of the present invention, illustrating a free standing microstructure.

FIGS. 2 and 4 show the optical image of the FIGS. 1 and 3 wafers after sacrificial silicon oxide layer removal, respectively, using the composition and method described herein. Following removal of the sacrificial silicon oxide layer, the free standing, stiction-free microstructures can be clearly seen.

Figure 5:
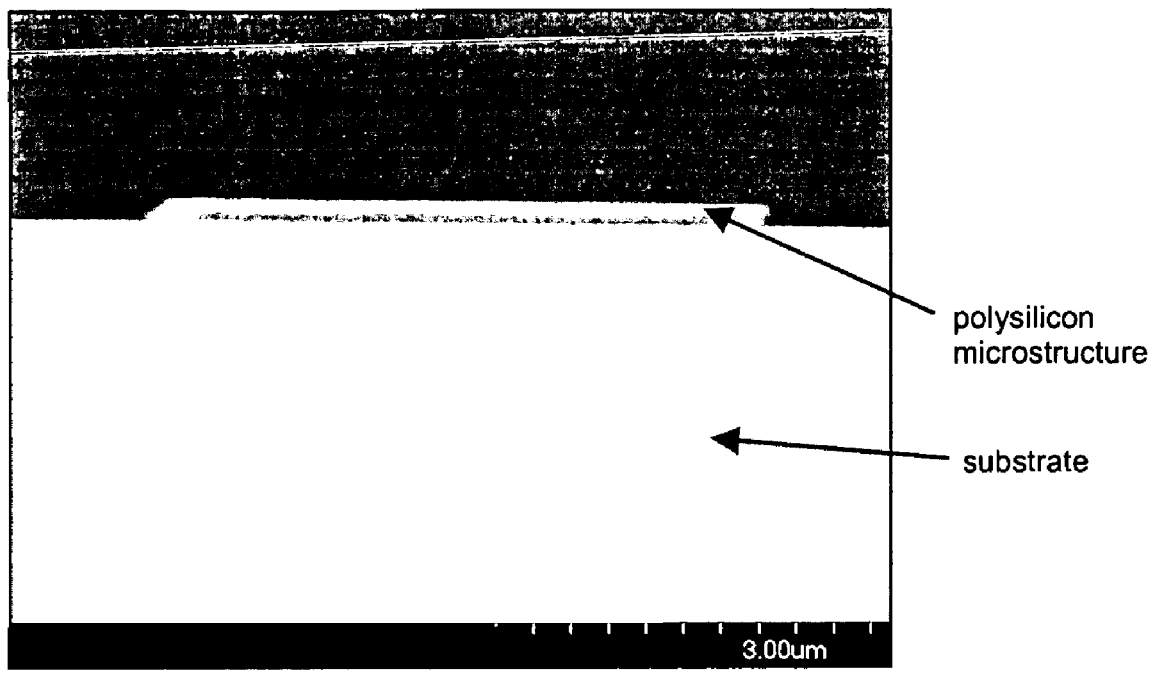
FIG. 5 is a sample etched with a SCF-based etching composition of the present invention, illustrating a free standing microstructure.

FIG. 5 is an optical image of a free-standing microstructure produced using the composition and method of the present invention.

The above-described photographs thus evidence the efficacy of SCF-based etching compositions in accordance with the invention, for removal of sacrificial layers from wafer substrates.

Accordingly, while the invention has been described herein in reference to specific aspects, features and illustrative embodiments of the invention, it will be appreciated that the utility of the invention is not thus limited, but rather extends to and encompasses numerous other aspects, features and embodiments. Accordingly, the claims hereafter set forth are intended to be correspondingly broadly construed, as including all such aspects, features and embodiments, within their spirit and scope.

What is claimed is:

1. A supercritical fluid (SFC)-based composition, comprising at least one co-solvent, at least one etchant species, and optionally at least one surfactant, wherein said at least one etchant comprises an alkyl phosphonium difluoride $((R)_4PNF_2)$, where R is a $C_1-C_4$ alkyl group, and wherein said SFC-based composition is useful for etching sacrificial silicon-containing layers.

2. The composition of claim 1, comprising SFC, wherein the SFC comprises a species selected from the group consisting of carbon dioxide, oxygen, argon, krypton, xenon, and ammonia.

3. The composition of claim 2, wherein the SFC comprises carbon dioxide.

4. The composition of claim 1, wherein the co-solvent comprises at least one $C_1-C_6$ alcohol.

5. The composition of claim 1, wherein the co-solvent comprises methanol.

6. The composition of claim 1, wherein the co-solvent comprises isopropanol.

7. The composition of claim 1, wherein the sacrificial silicon-containing layer comprises a silicon-containing species selected from the group consisting of silicon oxide and silicon nitride.

8. The composition of claim 7, wherein the at least one etchant species comprises at least one bifluoride compound selected from the group consisting of ammonium bifluoride, and tetraalkylammonium bifluoride $((R)_4NHF_2)$, wherein R is a $C_1-C_4$ alkyl group.

9. The composition of claim 1, wherein the surfactant comprises at least one nonionic or anionic surfactant, or a combination thereof.

10. The composition of claim 9, wherein the nonionic surfactant is selected from the group consisting of fluoroalkyl surfactants, polyethylene glycols, polypropylene glycols, polyethylene ethers, polypropylene glycol ethers, carboxylic acid salts, dodecylbenzenesulfonic acid; dodecylbeuzenesulfonic salts, polyaciylate polymers, dinonylphenyl polyoxyethylene, silicone polymers, modified silicone polymers, acetylenic diols, modified acetylenic diols, alkylammonium salts, modified alkylammonium salts, and combinations comprising at least one of the foregoing.

11. The composition of claim 9, wherein the nonionic surfactant comprises a modified acetylenic diol.

12. The composition of claim 1, wherein the etching composition comprises about 75.0 wt % to about 99.5 wt % SCF, about 0.3 wt % to about 22.5 wt % co-solvent, about 0.01 wt % to about 5.0 wt % etchant species, and about 0.01 wt % to about 5.0 wt % surfactant, based on the total weight of the composition.

13. The composition of claim 1, further comprising silicon-containing residue material.

14. The composition of claim 13, wherein the silicon-containing residue material is selected from the group consisting of silicon oxide and silicon nitride.

15. A method of removing silicon-containing substances from a substrate having same thereon, said method comprising contacting the substrate with a SCF-based composition comprising at least one co-solvent, at least one etchant species, and optionally at least one surfactant, for sufficient time and under sufficient contacting conditions to remove the silicon-containing substances from the substrate, wherein said at least one etchant comprises an alkyl phosphonium difluoride $((R)_4PHF_2)$, where R is a $C_1-C_4$ alkyl group.

16. The method of claim 15, comprising SCF, wherein the SCF is selected from the group consisting of carbon dioxide, oxygen, argon, krypton, xenon, and ammonia.

17. The method of claim 16, wherein the SCF is carbon dioxide.

18. The method of claim 15, wherein the contacting conditions comprise pressures in a range of from about 1400 to about 4400 psi.

19. The method of claim 15, wherein said contacting time is in a range of from about 30 seconds to about 30 minutes.

20. The method of claim 15, wherein the co-solvent comprises at least one $C_1-C_6$ alcohol.

21. The method of claim 15, wherein the co-solvent comprises methanol.

22. The method of claim 15, wherein the co-solvent comprises isopropanol (IPA).

23. The method of claim 15, wherein the silicon-containing substance is selected from the group consisting of silicon oxide and silicon nitride.

24. The method of claim 15, wherein the at least one etchant species comprises at least one additional bifluoride compound selected from the group consisting of ammonium bifluoride, and tetraalkylammonium difluoride $((R)_4NHF_2)$, wherein R is a $C_1-C_4$ alkyl group.

25. The method of claim 15, wherein the surfactant comprises at least one nonionic or anionic surfactant, or a combination thereof.

26. The method of claim 25, wherein the nonionic surfactant is selected from the group consisting of fluoroalkyl surfactants, polyethylene glycols, polypropylene glycols, polyethylene ethers, polypropylene glycol ethers, carboxylic acid salts, dodecylbenzenesulfonic acid, dodecylbenzenesulfonic salts, polyacrylate polymers, dinonylphenyl polyoxyethylene, silicone polymers, modified silicone polymers, acetylenic diols, modified acetylenic diols, alkylammonium salts, modified alkylammonium salts, and combinations comprising at least one of the foregoing.

27. The method of claim 26, wherein the SCF-based composition comprises about 75.0 wt % to about 99.5 wt % SCF, about 0.3 wt % to about 22.5 wt % co-solvent, about 0.01 wt % to about 5.0 wt % etchant species, based on the total weight of the composition.

28. The method of claim 15, wherein the SCF-based composition comprises about 75.0 wt % to about 99.5 wt % SCF, about 0.3 wt % to about 22.5 wt % co-solvent, about 0.01 wt % to about 5.0 wt % etchant species, and about 0.01 wt % to about 5.0 wt % surfactant, based on the total weight of the composition.

29. The method of claim 15, wherein the contacting step comprises an etching cycle including (i) dynamic flow contacting of the etching composition with the silicon-containing substance, and/or (ii) static soaking contacting of the etching composition with the silicon-containing substance.

30. The method of claim 29, wherein said etching cycle comprises alternatingly and repetitively carrying out dynamic flow contacting and static soaking contacting of the silicon-containing substance.

31. The method of claim 15, further comprising the step of washing the substrate, at a region at which the silicon-containing substance has been removed, with a SCF/methanol/deionized water wash solution in a first washing step, and with a SCF in a second washing step, to remove residual precipitated chemical additives in said first washing step, and to remove residual precipitated chemical additives and/or residual alcohol in said second washing step.

32. The method of claim 31, wherein the SCF is $SCCO_2$.

* * * * *